(12) United States Patent
Jang

(10) Patent No.: US 7,884,014 B2
(45) Date of Patent: Feb. 8, 2011

(54) METHOD OF FORMING CONTACT STRUCTURE WITH CONTACT SPACER AND METHOD OF FABRICATING SEMICONDUCTOR DEVICE USING THE SAME

(75) Inventor: Yoon-Taek Jang, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 5 days.

(21) Appl. No.: 12/171,119

(22) Filed: Jul. 10, 2008

(65) Prior Publication Data

US 2009/0017629 A1 Jan. 15, 2009

(30) Foreign Application Priority Data

Jul. 10, 2007 (KR) ...................... 10-2007-0069288

(51) Int. Cl.
*H01L 21/4763* (2006.01)
(52) U.S. Cl. ................. 438/639; 438/640; 257/E21.578
(58) Field of Classification Search .......... 438/637–640
See application file for complete search history.

(56) References Cited

U.S. PATENT DOCUMENTS 6,825,112 B2 11/2004 Ando 7,176,127 B2 * 2/2007 Nakamura ................... 438/639

FOREIGN PATENT DOCUMENTS

| JP | 2000-306862 | 11/2000 |
|---|---|---|
| KR | 2000-0021158 | 4/2000 |
| KR | 10-2005-0066369 | 6/2005 |

OTHER PUBLICATIONS

Bernhardt, A.F., et al., Arrays of Field Emission Cathode Structures with Sub-300 nm gates, J. Vac. Sci. Technol. B. 18(3), May/Jun. 2000, pp. 1212-1215, vol. 18, No. 3.

* cited by examiner

*Primary Examiner*—Jack Chen
(74) *Attorney, Agent, or Firm*—Volentine & Whitt, PLLC

(57) ABSTRACT

A method of forming a contact structure with a contact spacer and a method of fabricating a semiconductor device using the same. In the method of forming a contact structure, an interlayer dielectric layer is formed on a semiconductor substrate. The interlayer dielectric layer is patterned, thereby forming a contact hole for exposing a predetermined region of the semiconductor substrate. A contact spacer is formed on a sidewall of the contact hole using a deposition method having an inclined deposition direction with respect to a main surface of the semiconductor substrate. The deposition direction may be set between the main surface and a normal with respect to the main surface. Further, there is provided a method of fabricating a semiconductor device using the method of forming the contact structure.

11 Claims, 17 Drawing Sheets

METHOD OF FORMING CONTACT STRUCTURE WITH CONTACT SPACER AND METHOD OF FABRICATING SEMICONDUCTOR DEVICE USING THE SAME

CROSS-REFERENCE TO RELATED APPLICATION

This application claims priority from Korean Patent Application No. 2007-69288, filed Jul. 10, 2007, the disclosure of which is hereby incorporated by reference in its entirety.

BACKGROUND

1. Technical Field

The present invention relates to a method of fabricating a semiconductor device, and particularly, to a method of forming a contact structure with a contact space, and a method of fabricating a semiconductor device using the same.

2. Discussion of the Related Art

In general, a semiconductor device includes an integrated circuit provided with such discrete devices as transistors, resistors and capacitors. The discrete devices can be electrically coupled to one another through contact holes passing through an interlayer dielectric layer.

As the integration degree of a semiconductor device increases, the size of the contact holes and the interval between the contact holes are gradually reduced. Therefore, a process margin for forming the contact holes and interconnections filling the contact holes is reduced. As a result, the yield rate of the semiconductor device suffers.

FIGS. 1A through 1C are cross-sectional views illustrating a method of forming conventional contact structures.

Referring to FIG. 1A, a device isolation layer 14 is formed in a predetermined region of a semiconductor substrate 10 to define a plurality of active regions 12. An interlayer dielectric layer 16 is formed on the semiconductor substrate 10 having the active regions 12. The interlayer dielectric layer 16 may include a silicon oxide layer. Subsequently, a mask pattern having openings, e.g., a photoresist pattern 19, is formed on the interlayer dielectric layer 16. The interlayer dielectric layer 16 is etched using the photoresist pattern 19 as an etching mask, thereby forming contact holes 18 for exposing the active regions 12. At this time, the etching may be performed through dry etching using an etching gas containing carbon and fluorine. In this case, sidewalls of the contact holes 18 can be formed not to have a profile vertical to the semiconductor substrate 10 but to have a profile tapered to the semiconductor substrate 10. This is because a polymer produced in the dry etching is adhered to the sidewalls of the contact holes 18. Moreover, when the contact holes 18 have a high aspect ratio, each of the contact holes 18 can have a profile, an upper portion of which has a width greater than a lower portion thereof.

Referring to FIG. 1B, a cleaning process is performed with respect to top surfaces of the active regions 12 exposed through the contact holes 18, using a cleaning solution. A solution containing a fluoric acid may be used as the cleaning solution 20. While performing the cleaning process, the cleaning solution 20 may etch the interlayer dielectric layer 16 adjacent to the contact holes 18. As described above, the distance between the contact holes 18 adjacent to each other is decreased due to the increase of the integration degree of the semiconductor device, and thus the width of the interlayer dielectric layer 16 between the contact holes 18 is reduced. Therefore, when, the interlayer dielectric layer 16 is over- etched, an opening O passing through the interlayer dielectric layer 16 between the contact holes 18 in a lateral direction may be formed.

Referring to FIG. 1C, the photoresist pattern 19 is removed, and a conductive layer is then deposited on an entire surface of the semiconductor substrate 10 having the contact holes 18. Subsequently, the conductive layer is planarized to expose a top surface of the interlayer dielectric layer 16, thereby forming conductive layer patterns 22 filling the contact holes 18. Although the respective conductive layer patterns 22 are electrically isolated by the interlayer dielectric layer 16 therebetween, a short circuit occurs through the opening O. Therefore, the reliability of the semiconductor device is degraded.

A method of fabricating a semiconductor device with another conventional contact structure has been disclosed in Korean Patent Laid-Open Publication No. 2005-0066369, entitled "Method of forming contact hole of semiconductor device." According to Korean Patent Laid-Open Publication, before forming a contact hole for exposing a predetermined region of a semiconductor substrate, a trench is preliminarily formed in an interlayer dielectric layer. A spacer is formed on a sidewall of the trench, and the interlayer dielectric layer is then etched along the trench having the spacer, thereby forming the contact hole. However, since the contact hole has a lower area reduced by the width of the spacer, contact resistance between a contact plug filling the contact hole and the semiconductor substrate is increased.

SUMMARY OF THE INVENTION

Therefore, the present invention is directed to provide a method of forming a contact structure, which can enhance reliability of a semiconductor device by preventing a short circuit between contacts adjacent to each other.

Another object of the present invention is to provide a method of fabricating a semiconductor device, which can enhance reliability of a semiconductor device by preventing a short circuit between contacts adjacent to each other.

In accordance with an exemplary embodiment, the present invention provides a method of forming a contact structure. In the method of forming a contact structure, an interlayer dielectric layer may be formed on a semiconductor substrate. The interlayer dielectric layer may be patterned, thereby forming a contact hole for exposing a predetermined region of the semiconductor substrate. A contact spacer may be formed on a sidewall of the contact hole using a deposition method having an inclined deposition direction with respect to a main surface of the semiconductor substrate. The deposition direction may be set between the main surface and a normal with respect to the main surface.

Further, the contact spacer may be formed on an upper sidewall of the contact hole.

Further, the deposition method may be performed using a physical vapor deposition (PVD) method. Preferably, the PVD method may be performed using e-beam evaporation or sputtering.

Further, the deposition direction may have a direction that is perpendicular to a horizontal surface, and the main surface of the semiconductor substrate may be inclined with respect to the horizontal surface.

Further, the forming of the contact spacer may be performed while rotating the semiconductor substrate.

Further, a spacer extension layer extending from the contact spacer and covering a top surface of the interlayer dielectric layer may be formed while forming the contact spacer.

Further, the contact spacer may include a material layer having an etch selectivity with respect to the interlayer dielectric layer.

Further, a wet cleaning process may be performed with respect to the semiconductor substrate having the contact hole.

Further, the contact hole may be formed through dry etching.

In accordance with another exemplary embodiment, the present invention provides a method of fabricating a semiconductor device. In the method of fabricating a semiconductor device, a lower interlayer dielectric layer may be formed on a semiconductor substrate. The lower interlayer dielectric layer may be patterned, thereby forming first and second pad contact holes for exposing predetermined regions of the semiconductor substrate. First and second pad contact spacers are respectively formed on sidewalls of the first and second pad contact holes using a deposition method having an inclined deposition direction with respect to a main surface of the semiconductor substrate. The deposition direction may be set between the main surface and a normal with respect to the main surface. First and second conductive pads are respectively formed in the first and second pad contact holes having the pad contact spacers. A middle interlayer dielectric layer covering the conductive pads and the lower interlayer dielectric layer may be formed. An interconnection pattern is formed on the middle interlayer dielectric layer. The interconnection pattern is electrically coupled to the first conductive pad through an interconnection contact hole passing through the middle interlayer dielectric layer. An upper interlayer dielectric layer covering the interconnection pattern and the middle interlayer dielectric layer may be formed. A node contact hole passing through the middle and upper interlayer dielectric layers to expose a top surface of the second conductive pad may also be formed.

Further, conductive patterns may be formed on the semiconductor substrate and conductive pattern spacers may be formed on sidewalls of the conductive patterns, before forming the lower interlayer dielectric layer. Further, the forming of the first and second pad contact holes may be performed by etching the lower interlayer dielectric layer using the conductive patterns and the conductive pattern spacers as an etching mask. Further, each of the conductive pattern may include a conductive layer pattern and a capping pattern, sequentially stacked. Further, the conductive patterns may be word line patterns, and the interconnection patterns may be bit line patterns, in which the bit line patterns intersects top surfaces of the word line patterns.

Further, the pad contact spacers may include material layers having an etch selectivity with respect to the lower interlayer dielectric layer.

Further, a wet cleaning process may be performed with respect to the semiconductor substrate having the pad contact holes before forming the first and second conductive pads.

Further, the forming of the node contact hole may include sequentially patterning the upper and middle interlayer dielectric layers, thereby forming a nod contact hole for exposing the top surface of the second conductive pad. Then, the node contact hole may be enlarged through an isotropic etching process.

Further, a metal silicide layer may be formed on the first conductive pad before forming the interconnection pattern. Further, the metal silicide layer may be surrounded by the first pad contact spacer.

Further, a storage node contact plug or storage node electrode may be formed in the node contact hole.

BRIEF DESCRIPTION OF THE DRAWINGS

The above and other features and advantages of the present invention will become more apparent to those of ordinary skill in the art by describing in detail preferred embodiments thereof with reference to the attached drawings in which:

FIGS. 3A through 10A are cross-sectional views taken along line I-I' in FIG. 2 for illustrating a method of fabricating a semiconductor device according to an embodiment of the present invention; and FIGS. 3B through 10B are cross-sectional views taken along line II-II' in FIG. 2 for illustrating the method of fabricating a semiconductor device according to the embodiment of the present invention.

DETAILED DESCRIPTION OF THE INVENTION

Figure 1A:
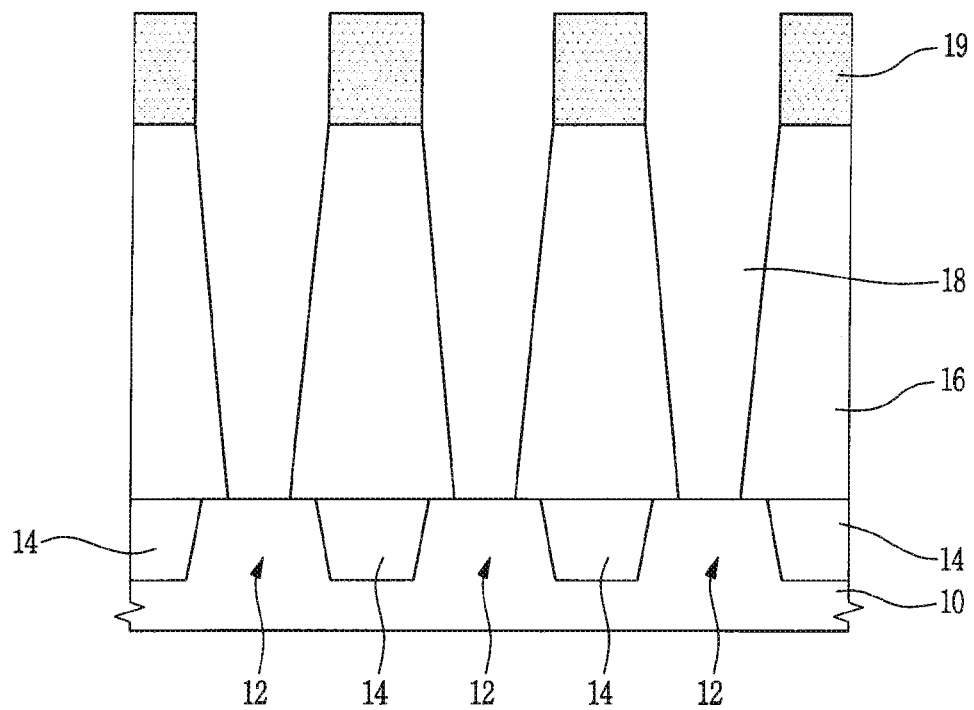
FIGS. 1A through 1C are cross-sectional views illustrating a method of forming conventional contact structures.
Figure 1B:
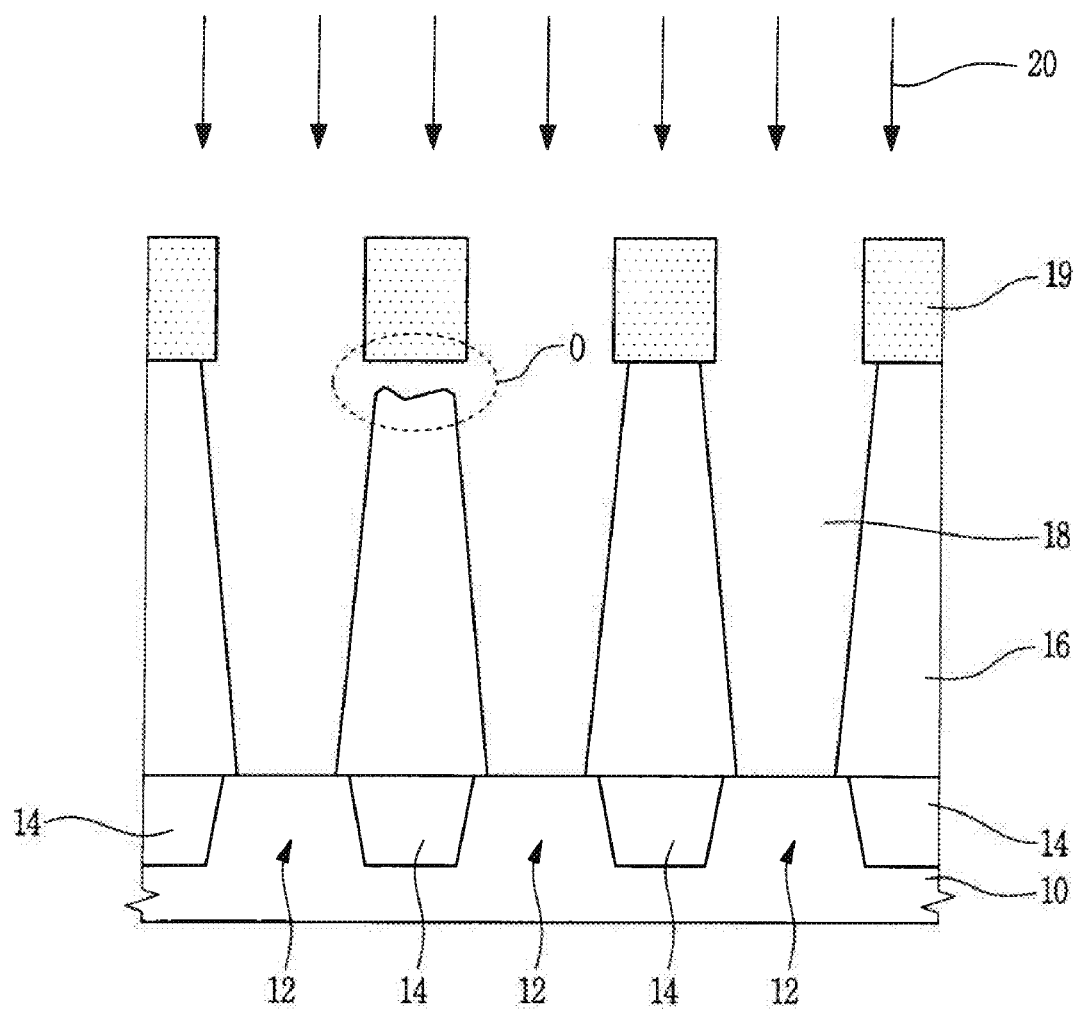
Figure 1C:
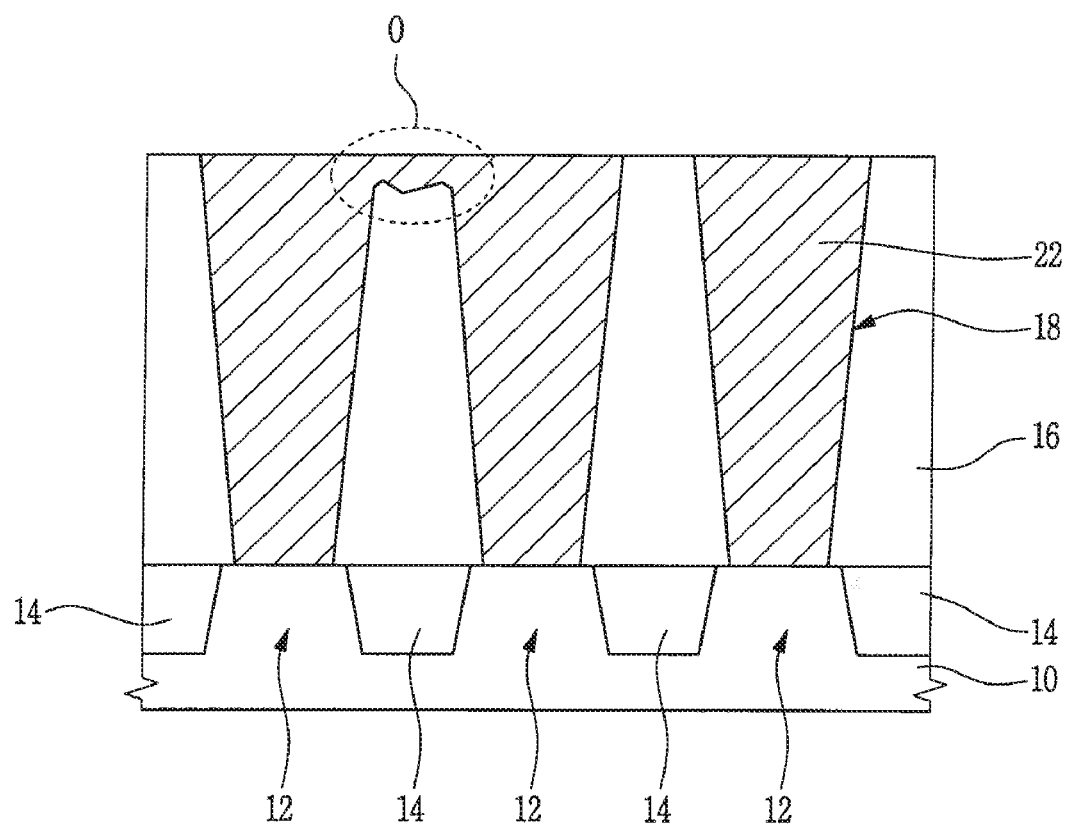

The present invention will now be described more fully hereinafter with reference to the accompanying drawings, in which preferred embodiments of the invention are shown. This invention may, however, be embodied in many different forms and should not be construed as being limited to the embodiments set forth herein. Rather, these embodiments are provided so that this disclosure will be thorough and complete, and will fully convey the scope of the invention to those skilled in the art. In the drawings, the thicknesses of layers and regions are exaggerated for clarity. Like numbers refer to like elements throughout the specification. It will be understood that when an element such as a layer, film, region or substrate is referred to as being "on" another element, it can be directly on the other element or intervening elements may also be present. In contrast, when an element is referred to as being "directly on" another element, there are no intervening elements present.

Figure 2:
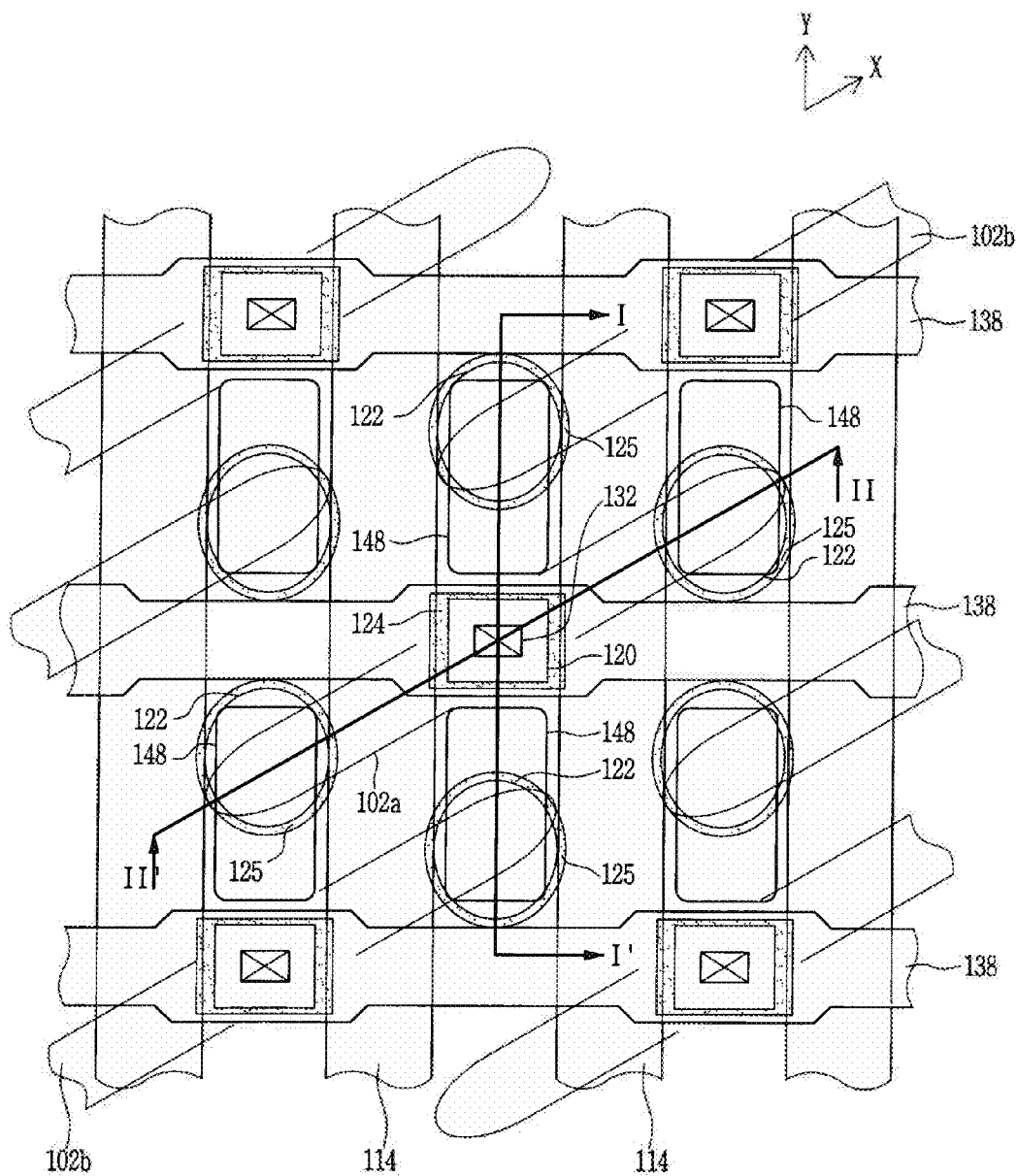
FIG. 2 is a plan view illustrating a portion of a cell array region in a DRAM applicable to a method of forming a contact structure according to an embodiment of the present invention.

A method of fabricating a semiconductor device according to an embodiment of the present invention will be described with reference to FIGS. 2 through 10B. FIG. 2 is a plan view illustrating a portion of a cell array region in a DRAM applicable to a method of forming a contact structure according to an embodiment of the present invention. FIGS. 3A through 10A are cross-sectional views taken along line I-I' in FIG. 2 for illustrating the method of fabricating a semiconductor device according to the embodiment of the present invention, and FIGS. 3B through 10B are cross-sectional views taken along line II-II' in FIG. 2 for illustrating the method of fabricating a semiconductor device according to the embodiment of the present invention. The method of forming a contact structure according to the embodiment of the present invention is not limited to the DRAM including a DRAM cell array region but is applicable to all of the semiconductor devices having contact structures, e.g., flash memories or phase-change memories (PRAMs).

Figure 3A:
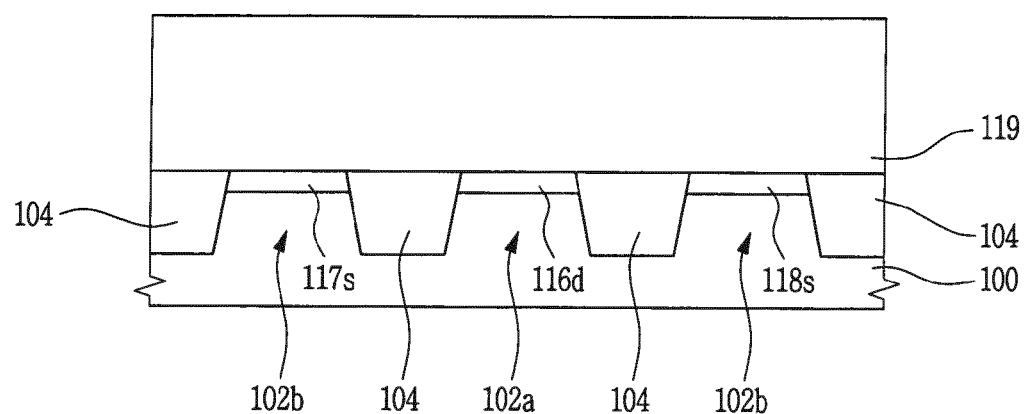
Figure 3B:
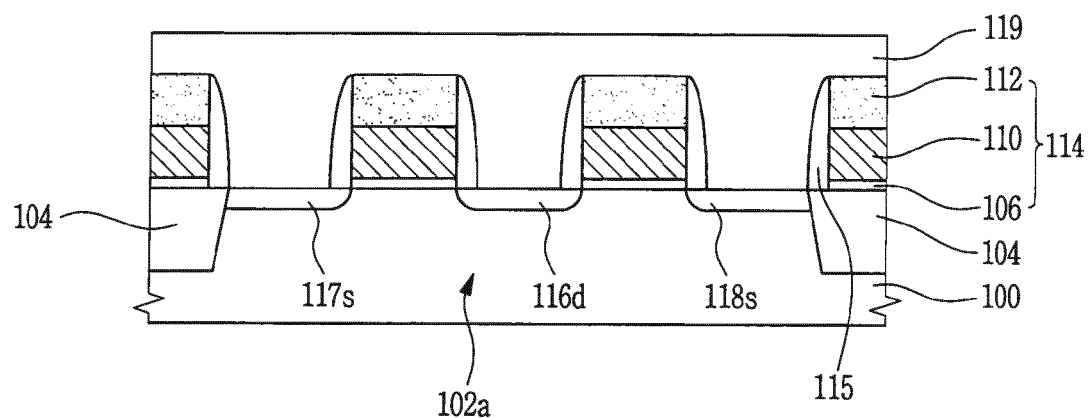

Referring to FIGS. 2, 3A and 3B, a device isolation layer 104 is formed in a predetermined region of a semiconductor substrate 100 to define first and second active regions 102a and 102b. The semiconductor substrate 100 may include a bulk substrate or a silicon on insulator (SOI) substrate. The device isolation layer 104 may include a high-density plasma oxide (HDP oxide) and an insulating layer. Conductive patterns 114 intersecting top surfaces of the first and second active regions 102a and 102b and the device isolation layer 104 are formed on the semiconductor substrate 100 having the first and second active regions 102a and 102b, using a well-known method. As illustrated in FIG. 2, the conductive patterns 114 can correspond to word line patterns 114 in a DRAM cell. Each of the word line patterns 114 includes a gate insulating layer 106, a word line 110 and a word line capping pattern 112, sequentially stacked. The word line 110 may include a doped poly-silicon layer.

Subsequently, impurity ions may be implanted into the active regions 102a and 102b using the word line patterns 114 and the device isolation layer 104 as an ion implantation mask, thereby forming common drain regions 116d, first source regions 117s and second source regions 118s. The common drain regions 116d may be formed in center portions of the active layers 102a and 102b, and the first and second source regions 117s and 118s may be respectively formed in first and second end portions of the active regions 102a and 102b. In FIG. 3B, the common drain region 116d, the first source region 117s and the word line 110 formed on a channel region between the common drain region 116d and the first source region 117s can comprise a first access transistor. The common drain region 116d, the second source region 118s and the word line 110 formed on a channel region between the common drain region 116d and the second source region 118s can comprise a second access transistor.

Conductive pattern spacers 115, i.e., word line pattern spacers 115, may be formed on sidewalls of the word line patterns 114. The word line capping patterns 112 and the word line pattern spacers 115 may include insulating layers, e.g., silicon nitride layers, having an etch selectivity with respect to silicon oxide layers widely used as interlayer dielectric layers of semiconductor devices. A lower interlayer dielectric layer 119 may be formed on the semiconductor substrate 100 having the word line pattern spacers 115. The lower interlayer dielectric layer 119 may include a silicon oxide layer.

Figure 4A:
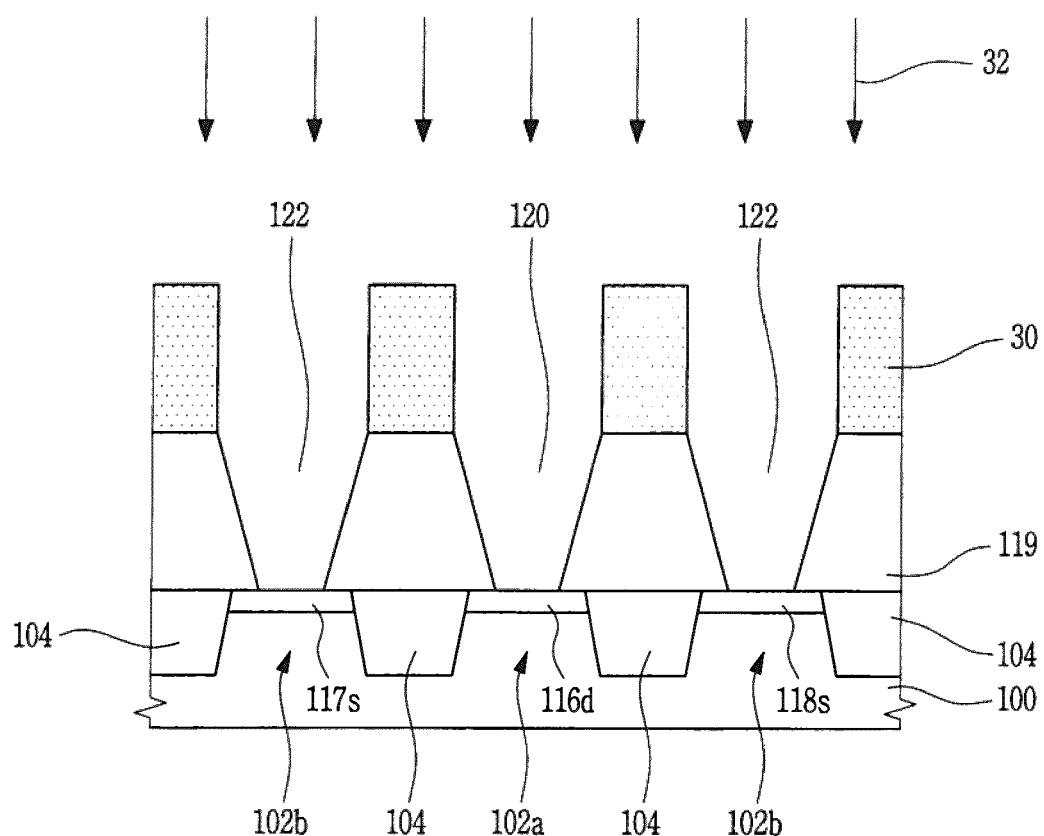
Figure 4B:
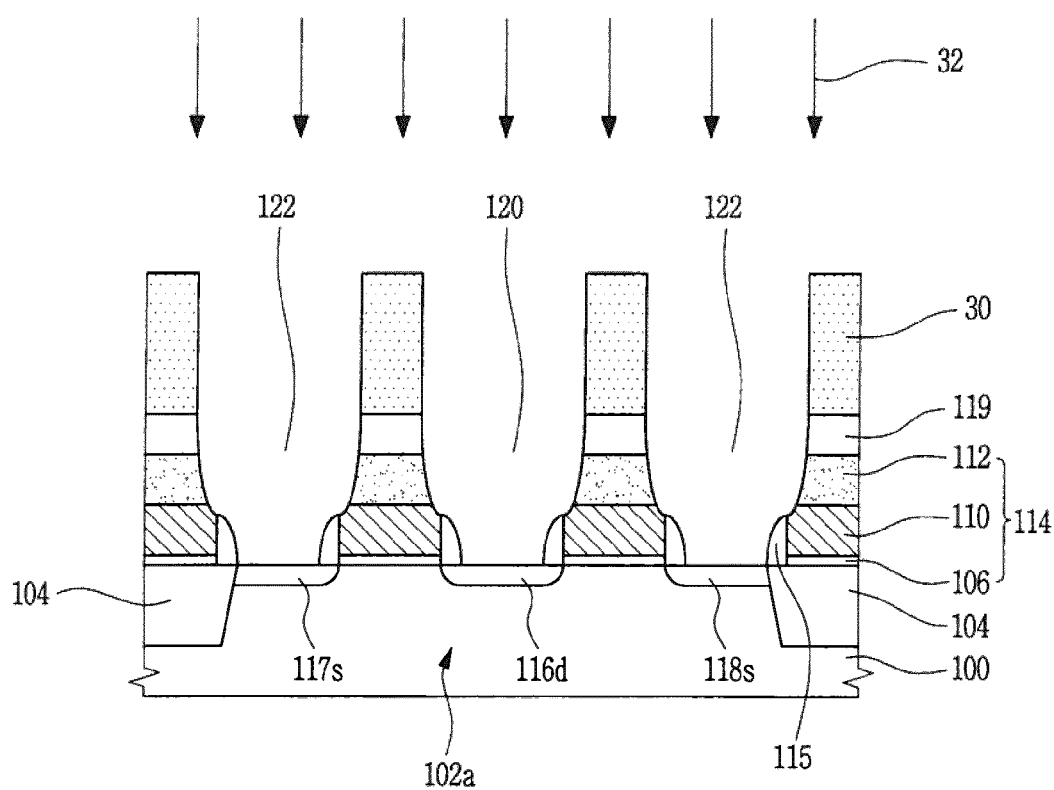

Referring to FIGS. 2, 4A and 4B, a mask pattern having openings for exposing predetermined regions, e.g., a photoresist pattern 30, is formed on the lower interlayer dielectric layer 119. Subsequently, the lower interlayer dielectric layer 119 can be etched using the photoresist pattern 30, the word line capping patterns 112 and the word line pattern spacers 115 as etching masks. That is, the etching may be performed using a self-aligned contact technique. The etching can be performed through dry etching. An etching gas 32 containing carbon and fluorine can be used in the dry etching. As a result, first and second contact holes 120 and 122 may be formed. The first contact holes 120 may be used for exposing the common drain regions 116d, and the second contact holes 122 may be used for exposing the source regions 117s and 118s. The first and second contact holes 120 and 122 may be formed between the word line patterns 114 that are adjacent to one another. As illustrated in FIG. 4A, polymers produced during the dry etching in the process of forming the pad contact holes 120 and 122 may be adhered to lower sidewalls of the pad contact holes 120 and 122 such that sidewalls of the pad contact holes 120 and 122 can be formed to have a profile tapered to the semiconductor substrate 100. As illustrated in FIG. 4B, the word line capping patterns 112 and the word line pattern spacers 115, used as the etching masks, can be partially etched during the dry etching. As a result, portions of the word lines 110 can be exposed.

Figure 5A:
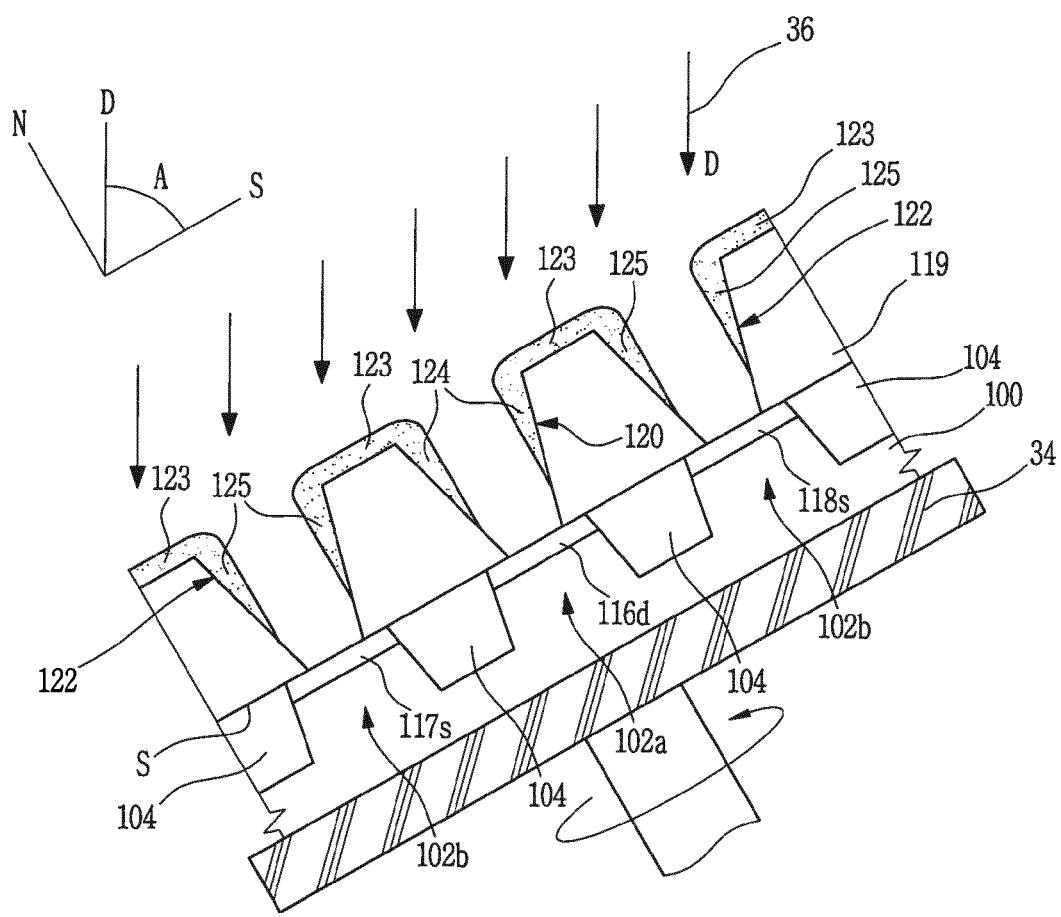
Figure 5B:
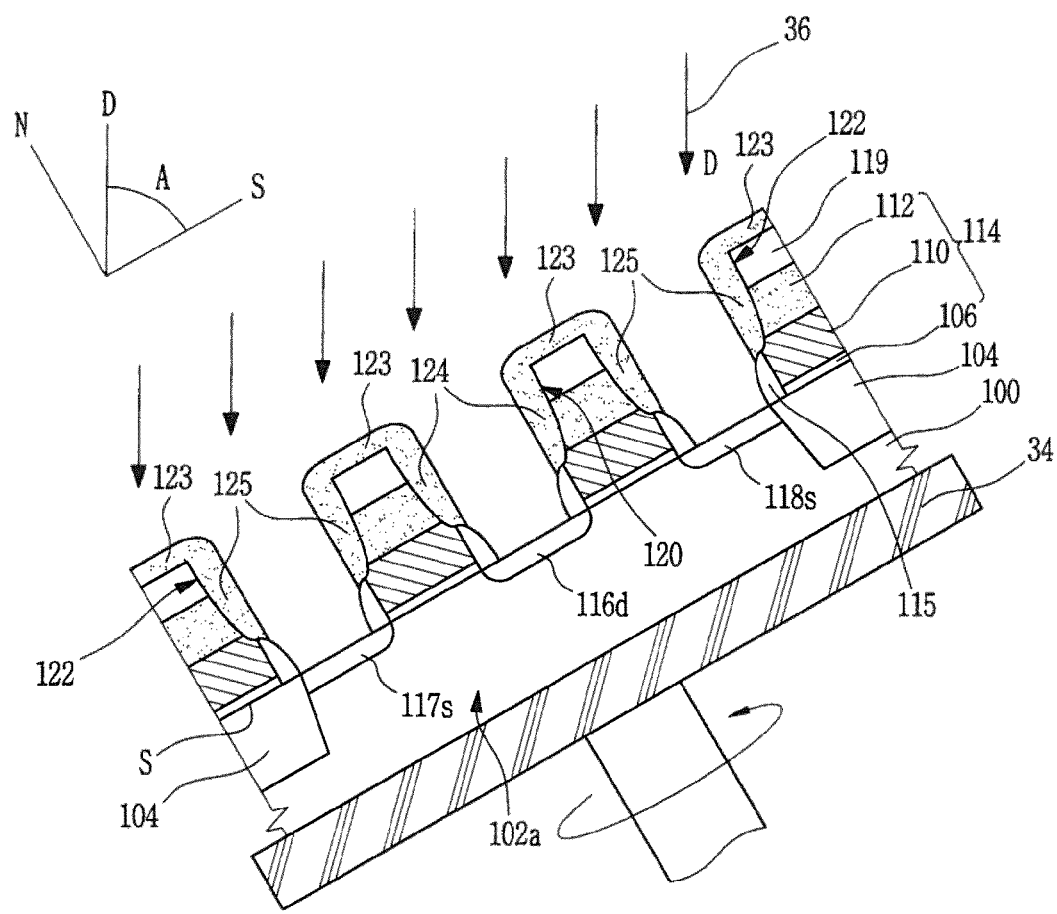

Referring to FIGS. 2, 5A and 5B, first and second pad contact spacers 124 and 125 covering the sidewalls of the first and second pad contact holes 120 and 122 are formed using a deposition method 36 having an inclined direction D with respect to a main surface S of the semiconductor substrate 100 having the pad contact holes 120 and 122. While forming the first and second pad contact spacers 124 and 125, spacer extension layers 123 covering a top surface of the lower interlayer dielectric layer 119 and extending from the pad contact spacers 124 and 125 are formed. The deposition direction D is set between the main surface S and a mathematical normal N with respect to the main surface S. Specifically, the deposition direction D has a predetermined angle A from the main surface S, and the angle A has a smaller value than that of the normal N with respect to the main surface S. In other words, the angle A has a value ranging from 0 to 90 degrees with respect to the main surface S. For example, the deposition direction D may be set so that it is perpendicular to a horizontal surface. Then, the main surface S of the semiconductor substrate 100 may be inclined with respect to the horizontal surface, so that the deposition direction D can have a predetermined angle A from the main surface S. In addition, the pad contact spacers 124 and 125 may be formed on entire sidewall surfaces or upper sidewall surfaces of the pad contact holes 120 and 122 by adjusting the angle A. When the pad contact spacers 124 and 125 are formed on the upper sidewalls of the pad contact holes 120 and 122, the exposed areas of the common drain regions 116d and the source regions 117s and 118s may not be reduced.

A physical vapor deposition (PVD) method may be used as the deposition method 36. This is because the PVD method has a characteristic in which atoms are deposited in a constant direction. The PVD method may be performed, for example, using e-beam evaporation or sputtering. When the sputtering is used as the PVD method, a silicon nitride solid target in a chamber of a PVD equipment may be disposed on the main surface S of the semiconductor substrate 100. In order to form the pad contact spacers 124 and 125 on both sidewalls of the pad contact holes 120 and 122, the semiconductor substrate 100 can be rotated using a support part 34 rotatable in the PVD equipment.

As illustrated in FIG. 5B, the pad contact spacers 124 and 125 can be formed on the word line pattern spacers 115 to cover the exposed word lines 110. The pad contact spacers 124 and 125 and the spacer extension layers 123 may include silicon nitride layers or silicon oxide layers. Preferably, the pad contact spacers 124 and 125 and the spacer extension layers 123 may include insulating layers having an etch selectivity with respect to the lower interlayer dielectric layer 119, e.g., silicon nitride layers, in the process of performing wet or dry etching.

Figure 6A:
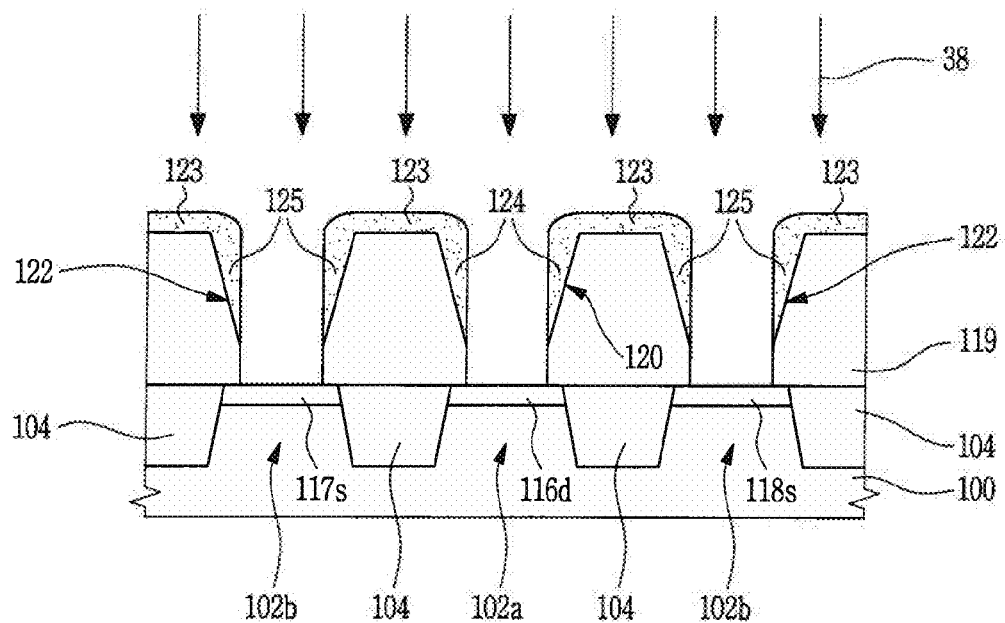
Figure 6B:
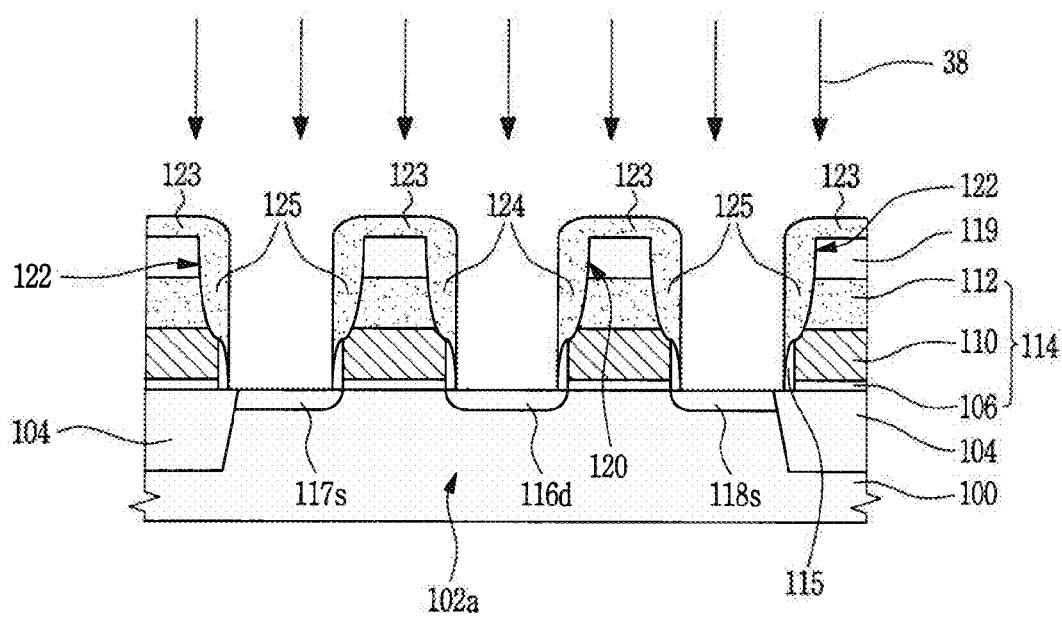

Referring to FIGS. 2, 6A and 6B, a wet cleaning process can be performed with the semiconductor substrate 100 having the pad contact holes 120 and 122 so as to extend the exposed areas of the common drain regions 116d and the source regions 117s and 118s and to eliminate contaminants in the pad contact holes 120 and 122. The wet cleaning process can be performed using a cleaning solution 38 containing a fluoric acid.

When the pad contact spacers 124 and 125 include silicon nitride layers, the pad contact spacers 124 and 125 are insulating layers having a lower etch rate than the lower interlayer dielectric layer 119 with respect to the cleaning solution 38. For this reason, the lower interlayer dielectric layer 119 surrounded by the pad contact spacers 124 and 125 is not etched. Therefore, as illustrated in FIG. 6A, an opening passing through the lower interlayer dielectric layer 119 in the lateral direction is not formed in the lower interlayer dielectric layer 119 between the first and second pad contact holes 120 and 122 adjacent to each other in the process of performing the wet cleaning process.

In FIG. 6B, similar to the description of FIG. 5B, the pad contact spacers 124 and 125 can be formed to cover the exposed word lines 110. Hence, during the wet cleaning process, the word lines 110 are not exposed any longer due to the existence of the pad contact spacers 124 and 125.

Figure 7A:
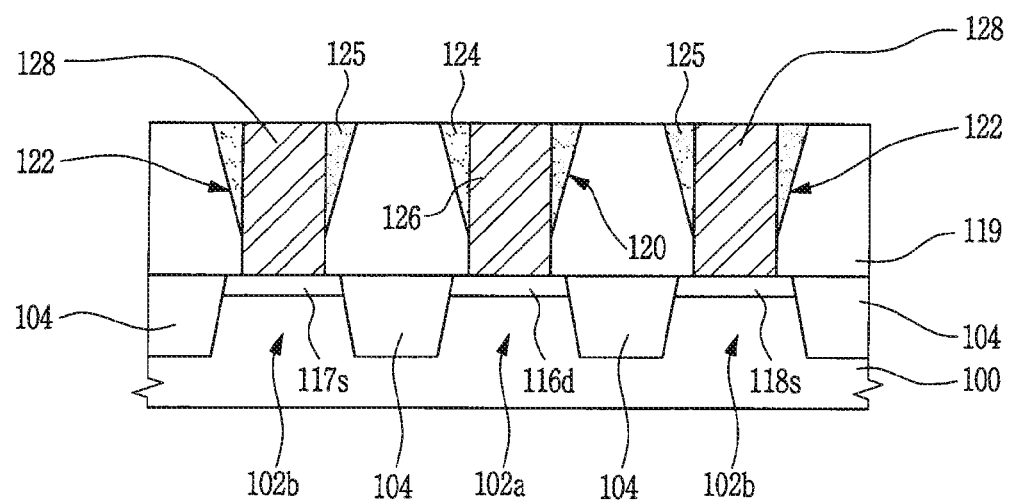
Figure 7B:
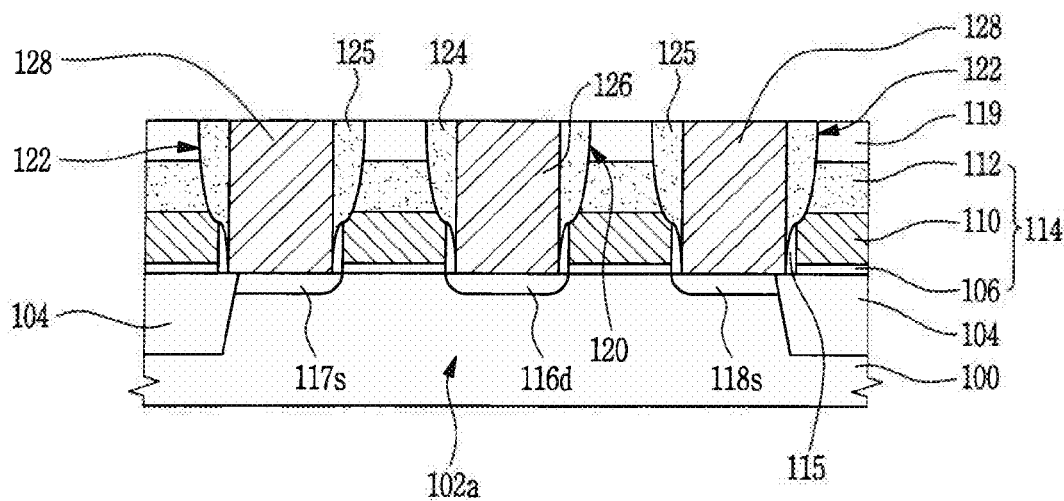

Referring to FIGS. 2, 7A and 7B, a conductive pad layer can be formed on the semiconductor substrate 100 having the first and second pad contact holes 120 and 122. Subsequently, first and second conductive pads 126 and 128 are respectively formed in the first and second pad contact holes 120 and 122 by planarizing the conductive pad layer. A chemical mechanical polishing (CMP) process or an etch back process may be employed as the planarization process. In the CMP process, the spacer extension layers 123 may be used as stop layers. Subsequently, the spacer extension layers 123 may be removed using the planarization process to expose the top surface of the lower interlayer dielectric layer 119. However, in some embodiments, a process of removing the spacer extension layers 123 may be omitted.

Meanwhile, the first and second conductive pads 126 and 128 may include doped silicon layers. The first conductive pads 126 can be electrically coupled to the common drain regions 116d, and the second conductive pads 128 can be electrically coupled to the first and second source regions 117s and 118s. That is, the first conductive pads 126 can correspond to bit line contact pads in DRAM cells, and the second conductive pads 128 can correspond to node contact pads in the DRAM cells. As described with reference to FIG. 6A, an opening passing through the lower interlayer dielectric layer 119 in the lateral direction is not formed in the lower interlayer dielectric layer 119 due to the existence of the pad contact spacers 124 and 125. Accordingly, short circuits between the first and second conductive pads 126 and 128 can be prevented. As described with reference to FIG. 6B, the word lines 110 are not exposed, so that short circuits between the word lines 114 and the conductive pads 126 and 128 can be prevented.

Figure 8A:
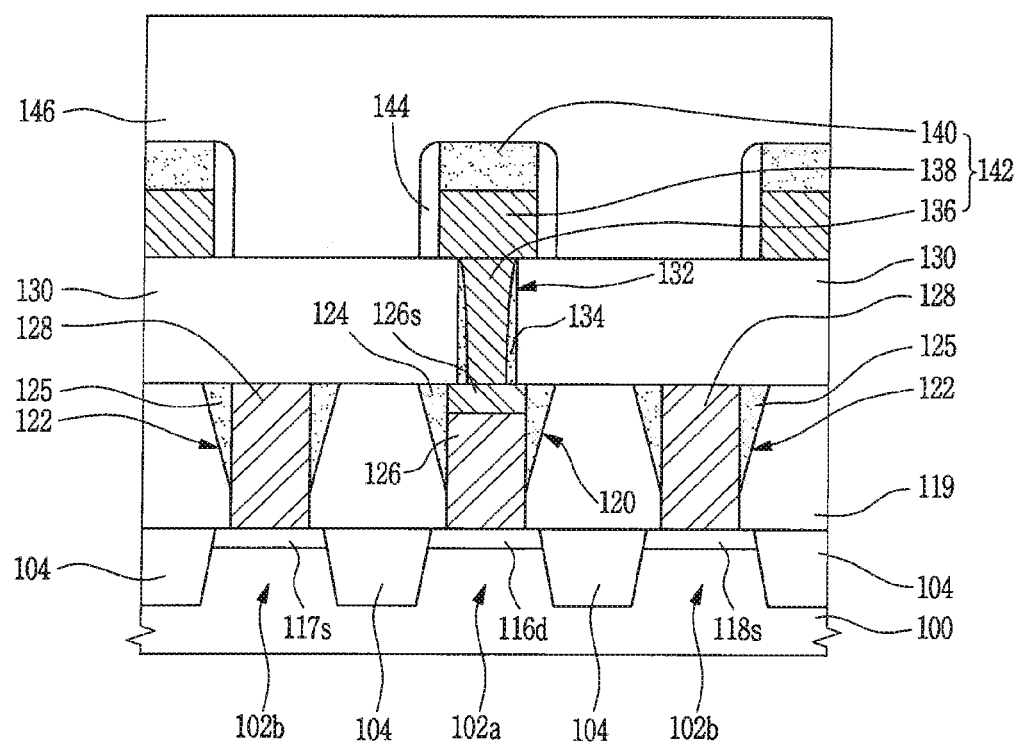
Figure 8B:
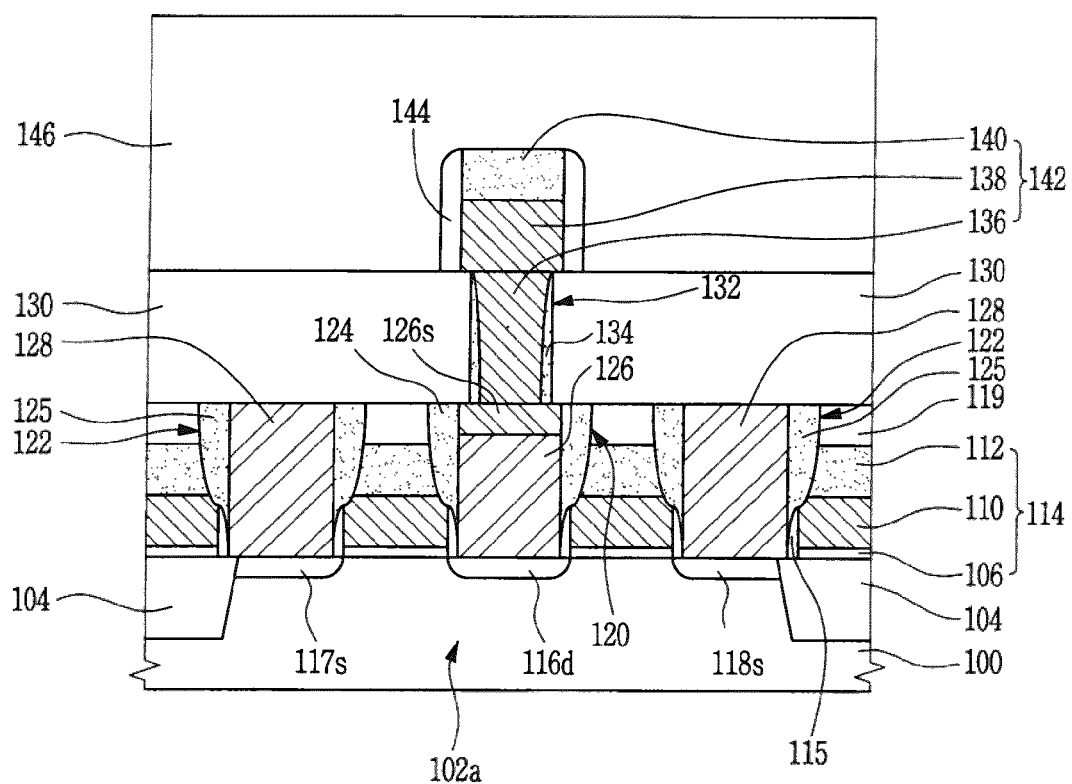

Referring to FIGS. 2, 8A and 8B, a middle interlayer dielectric layer 130 is formed on the semiconductor substrate 100 having the first and second conductive pads 126 and 128. The middle interlayer dielectric layer 130 may include an insulating layer that is substantially the same as the lower interlayer dielectric layer 119.

Subsequently, the middle interlayer dielectric layer 130 may be patterned to form interconnection contact holes 132 for exposing the first conductive pads 126. Interconnection contact spacers 134 may be formed on sidewalls of the interconnection contact holes 132. The interconnection contact spacers 134 may include silicon nitride layers or silicon oxy nitride layers.

A metal layer covering inner walls of the interconnection contact holes 132 and the middle interlayer dielectric layer 130 can be stacked. The metal layer may be at least one of W, Ti, Co, Ni and Ta. The semiconductor substrate 100 having the metal layer may be heat-treated, thereby forming metal silicide layers 126s on the first conductive pads 126. Subsequently, the metal layer remaining after being reacted is removed. That is, the metal silicide layers 126s can be formed in the first conductive pads 126 beneath the interconnection contact holes 132 using a silicidation process. In this case, the metal silicide layers 126s may be surrounded by the first pad contact spacers 124.

Subsequently, a conductive layer filling the interconnection contact holes 132 and covering the middle interlayer dielectric layer 130 can be stacked. As a result, interconnection contact plugs 136 are formed in the interconnection contact holes 132. The conductive layer including the interconnection contact plugs 136 may include metal layers such as tungsten. Capping layer patterns 140 can be formed on the conductive layer. The capping layer patterns 140 can be formed to intersect top surfaces of the word line patterns 114. The capping layer patterns 140 may include insulating layers such as silicon nitride layers. The conductive layer is etched using the capping layer patterns 140 as an etching mask, thereby forming conductive patterns 138. As a result, interconnection patterns 142 are formed, including the interconnection contact plugs 136, the conductive patterns 138 and the capping layer patterns 140, which are sequentially stacked. The interconnection patterns 142 can be electrically coupled to the first conductive pads 126 through the interconnection contact holes 132. As illustrated in FIG. 2, each of the interconnection patterns 142 may be employed as a bit line pattern in a DRAM cell.

Bit line spacers 144 may be formed on sidewalls of the bit line patterns 142. The bit line spacers 144 may include insulating layers, e.g., silicon nitride layers, having an etch selectivity with respect to the middle interlayer dielectric layer 130. Subsequently, an upper interlayer dielectric layer 146 is formed to cover the semiconductor substrate 100 having the bit line patterns 142 and the bit line spacers 144. The upper interlayer dielectric layer 146 may include a silicon oxide layer.

Figure 9A:
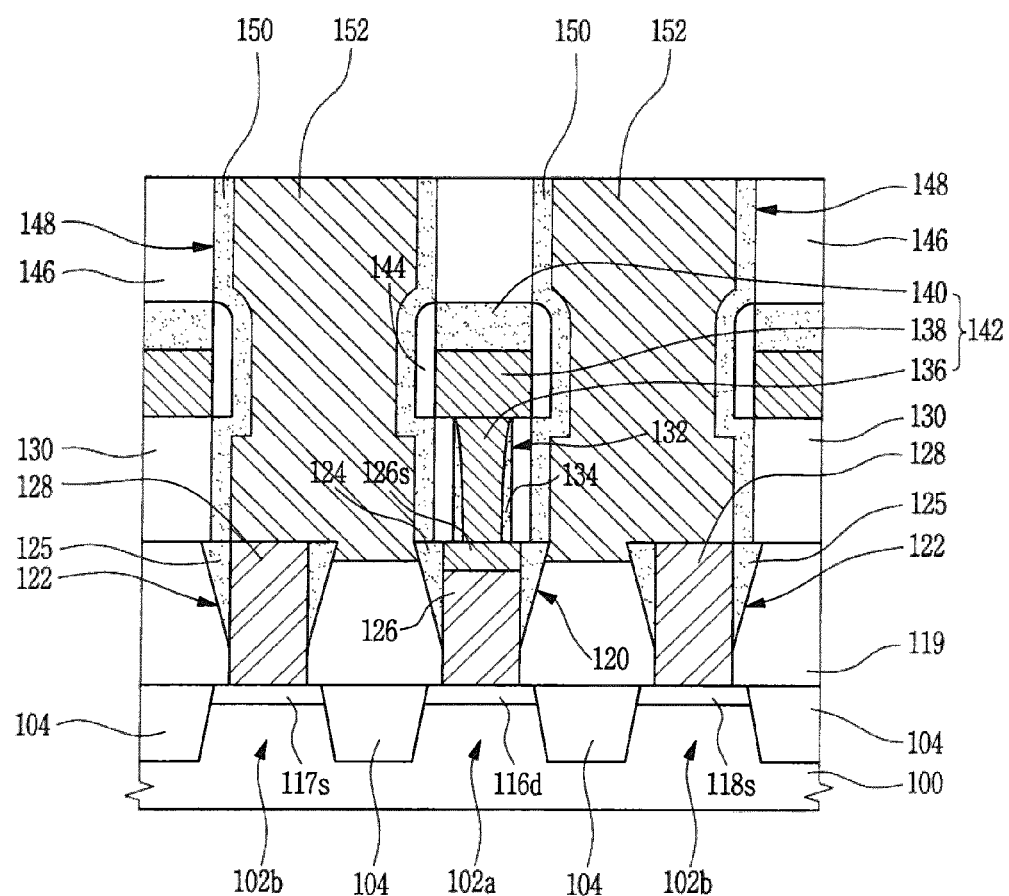
Figure 9B:
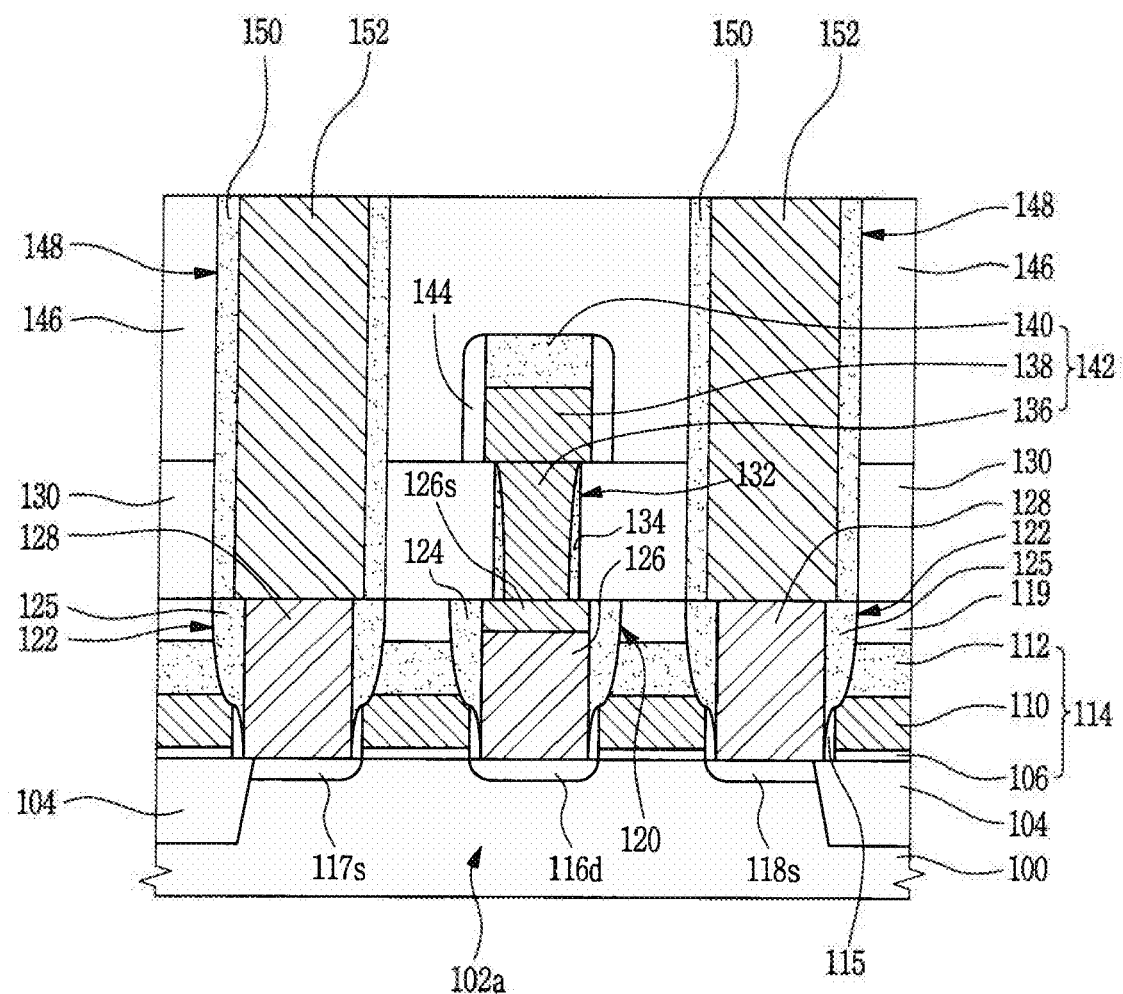

Referring to FIGS. 2, 9A and 9B, a photoresist pattern (not shown) can be formed on the semiconductor substrate 100 having the upper interlayer dielectric layer 146. The photoresist pattern may be formed to overlap with the word line patterns 114 illustrated in FIG. 2. The upper and middle interlayer dielectric layers 146 and 130 are etched using the photoresist pattern, the bit line patterns 142, and the bit line spacers 144 as etching masks, thereby forming node contact holes 148 for exposing the second conductive patterns 128.

Subsequently, a wet etching process may be applied to the semiconductor substrate 100 having the node contact holes 148 so as to extend the exposed areas of the second conductive pads 128 and to eliminate contaminants in the node contact holes 148. The wet etching process may be performed using an oxide etching solution containing a fluoric acid solution. As a result, the middle interlayer dielectric layer 130 and the node contact holes 148 enlarged by the isotropically-etched upper interlayer dielectric layer 146 can be formed. Although the lower interlayer dielectric layer 119 adjacent to the first conductive pads 126 is recessed as illustrated in FIG. 9A while performing the wet etching process for forming the enlarged node contact holes 148, the first pad contact spacers 124 can serve as etch stop layers. While performing the wet etching process, the metal silicide layers 126s formed on the first conductive pads 126 are not exposed due to the existence of the first pad contact spacers 124. That is, the first pad contact spacers 124 prevent the metal silicide layers 126s from being damaged or removed during the wet etching process for forming the enlarged node contact holes 148.

Node contact spacers 150 can be formed on sidewalls of the enlarged node contact holes 148. While forming the enlarged node contact holes 148, top surfaces of the metal silicide layers 126s and the bit lines 138 may be exposed due to the over-etching of the middle and upper interlayer dielectric layers 130 and 146. In this case, the node contact spacers 150 may be formed to prevent the metal silicide layers 126s and the bit lines 138 from being electrically coupled to conductive patterns formed in the node contact holes 148 in a subsequent process.

Subsequently, conductive patterns, e.g., storage node contact plugs 152 in the DRAM, electrically coupled to the second conductive pads 128 through the enlarged node contact holes 148 are formed on the semiconductor substrate 100 having the node contact spacers 150. The storage node contact plugs 152 may be formed using a general method well known in the art.

Figure 10A:
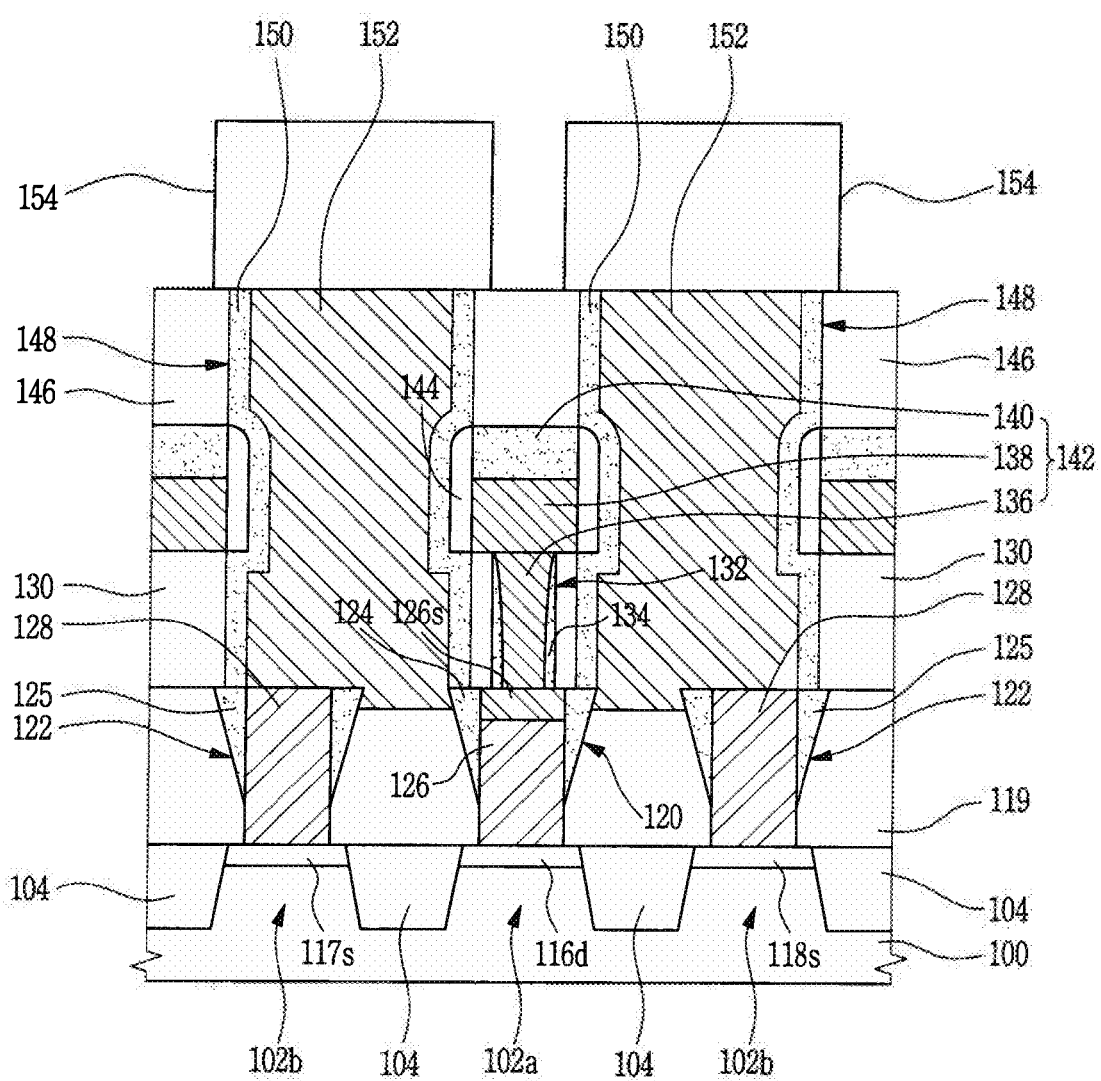
Figure 10B:
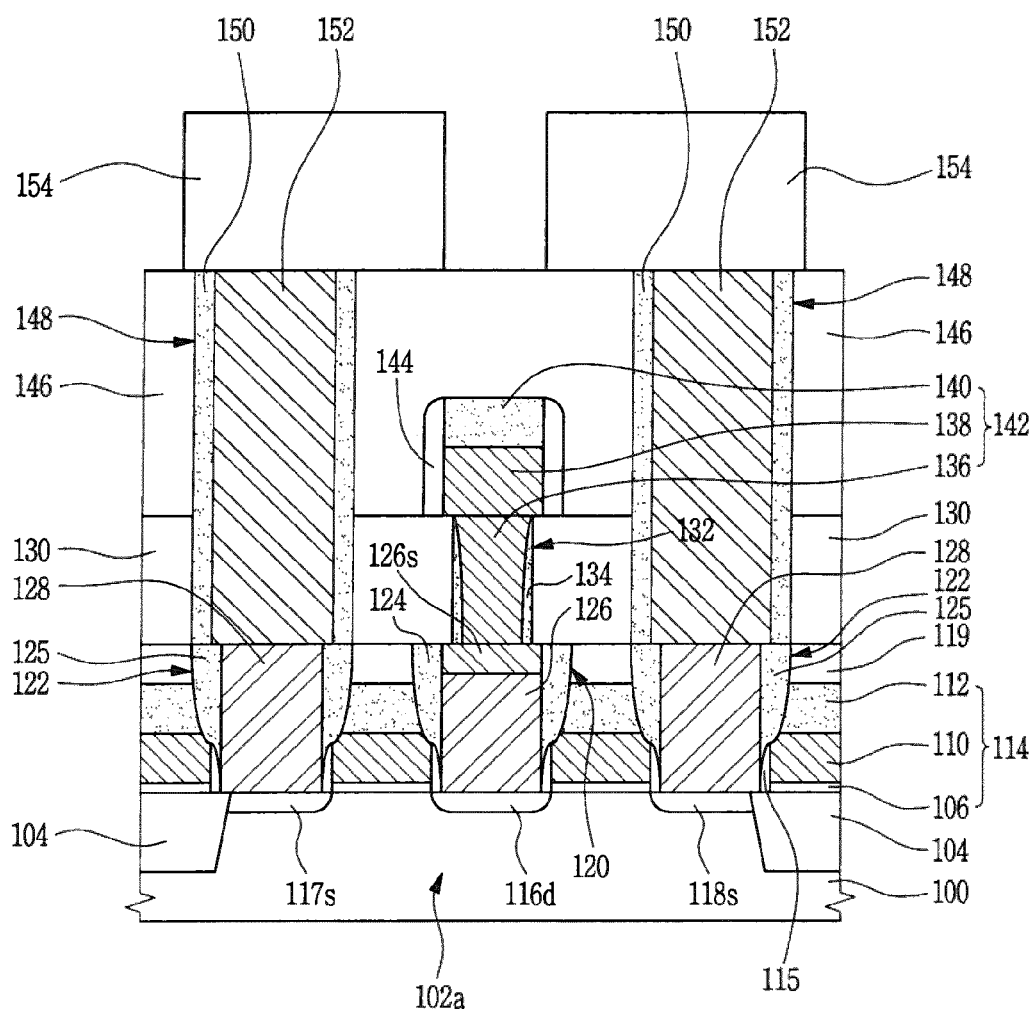

Referring to FIGS. 2, 10A and 10B, data storage elements 154 may be formed on the storage node contact plugs 152. For example, each of the data storage elements 154 may include a storage node electrode, a dielectric layer, and an upper electrode, sequentially stacked, in a DRAM cell. In other embodiments, storage node electrodes (not shown) electrically coupled to the second conductive pads 128 in the node contact holes 148 may be formed as the conductive patterns in place of the storage node contact plugs 152.

As described above, according to embodiments of the present invention, contact spacers are formed on sidewalls of contact holes formed in an interlayer dielectric layer using a deposition method with an inclined deposition direction. Accordingly, when performing a cleaning process with respect to the contact holes including the contact spacers, it is possible to prevent the interlayer dielectric layer between the contact holes from being etched. As a result, short circuits between contact plugs filling the contact holes are prevented, so that the reliability of a semiconductor device can be ensured.

In addition, conductive patterns and conductive pattern spacers formed on sidewalls of the conductive patterns are formed in the interlayer dielectric layer. In this case, the contact holes can be formed using the conductive patterns and the conductive pattern spacers as an etching mask. The conductive patterns and top surfaces of the conductive pattern spacers are etched, and thus a conductive layer forming the conductive patterns may be exposed. The contact spacers are formed on the exposed conductive layer, so that the reliability of the semiconductor device can be enhanced.

What is claimed is:

1. A method for forming a contact structure, comprising:
   forming an interlayer dielectric layer on a semiconductor substrate;
   forming, through the interlayer dielectric layer, a contact hole that tapers toward and exposes a predetermined region of the semiconductor substrate; and
   forming a contact spacer of electrically insulating material on a sidewall of the interlayer dielectric layer which delimits the contact hole, by depositing material on the sidewall in a direction that is oblique with respect to a major surface of the semiconductor substrate, whereby the depositing of the electrically insulating material occurs at an angle between that subtended by the plane of the major surface and a plane normal to the major surface.

2. The method according to claim 1, wherein the contact spacer is formed only on an upper portion of the interlayer dielectric layer such that a lower portion of the contact hole is devoid of the electrically insulating material.

3. The method according to claim 1, wherein the forming of the contact spacer comprises a physical vapor deposition (PVD) method.

4. The method according to claim 3, wherein the PVD method is performed using e-beam evaporation or sputtering.

5. The method according to claim 1, wherein in the forming of the contact spacer the direction in which the electrically insulating material is deposited is perpendicular to the horizontal, and wherein the major surface of the semiconductor substrate is inclined with respect to the horizontal.

6. The method according to claim 1, wherein the forming of the contact spacer comprises rotating the semiconductor substrate.

7. The method according to claim 1, wherein the depositing of the electrically insulating material includes depositing electrically insulating material on an upper surface of the interlayer dielectric layer to thereby form a spacer extension contiguous with and extending from the contact spacer over the upper surface of the interlayer dielectric layer.

8. The method according to claim 1, wherein the electrically insulating material of the contact spacer has a lower etch rate than the interlayer dielectric layer with respect to a given solution, and further comprising subsequently treating the structure having the contact spacer with the solution, whereby the contact spacer protects at least the upper portion of the interlayer dielectric layer during the treating.

9. The method according to claim 1, further comprising after the contact spacer has been formed, performing a wet cleaning of the predetermined region of the semiconductor substrate exposed by the contact hole.

10. The method according to claim 1, wherein the forming of the contact hole comprises dry etching the interlayer dielectric layer.

11. The method according to claim 1, wherein the forming of the contact hole comprises forming a mask pattern on the interlayer dielectric layer, and etching the interlayer dielectric layer using the mask pattern as an etch mask, wherein the etching mask is removed before the contact spacer is formed, and further comprising after the contact spacer has been formed, performing a wet cleaning of the predetermined region of the semiconductor substrate exposed by the contact hole.

* * * * *